(12) United States Patent
Schneider et al.

(10) Patent No.: US 7,994,863 B2
(45) Date of Patent: Aug. 9, 2011

(54) ELECTRONIC SYSTEM HAVING COMMON MODE VOLTAGE RANGE ENHANCEMENT

(75) Inventors: Edmund M. Schneider, Austin, TX (US); Murari L. Kejariwal, Austin, TX (US); Stephen T. Hodapp, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 98 days.

(21) Appl. No.: 12/347,155

(22) Filed: Dec. 31, 2008

(65) Prior Publication Data
US 2010/0164631 A1    Jul. 1, 2010

(51) Int. Cl.
*H03F 3/04* (2006.01)
(52) U.S. Cl. .............. 330/297; 330/69; 330/258
(58) Field of Classification Search .............. 330/297, 330/258, 69
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,414,493 A | 11/1983 | Henrich |
| 4,476,706 A | 10/1984 | Hadden et al. |
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |
| 4,937,728 A | 6/1990 | Leonardi |
| 4,940,929 A | 7/1990 | Williams |

(Continued)

FOREIGN PATENT DOCUMENTS
EP    0585789 A1    3/1994
(Continued)

OTHER PUBLICATIONS

AN-H52 Application Note: "HV9931 Unity Power Factor LED Lamp Driver" Mar. 7, 2007, SUPERTEX Inc., Sunnyvale, CA, USA.

(Continued)

*Primary Examiner* — Patricia Nguyen
(74) *Attorney, Agent, or Firm* — Hamilton & Terrile, LLP; Kent B. Chambers

(57) ABSTRACT

An electronic system generates at least one floating supply voltage, wherein during operation of the circuit the floating supply voltage tracks a common mode voltage of first and second differential input signals. By tracking the common mode voltage, in at least one embodiment, the floating supply voltage adjusts as the common mode voltage changes. Thus, the floating supply voltages can be based upon the peak-to-peak values of the first and second output signals without factoring in the common mode voltage. In at least one embodiment, the electronic system provides the floating supply voltages to an amplifier. The amplifier amplifies the first and second differential input signals and generates differential output signals. A differential sampling circuit samples the differential output signals to cancel the common mode voltage from the differential output signals. In at least one embodiment, an analog-to-digital converter converts the sampled differential output signals into a digital output signal.

27 Claims, 10 Drawing Sheets

U.S. PATENT DOCUMENTS

| | | | |
|---|---|---|---|
| 4,973,919 A | 11/1990 | Allfather | |
| 4,979,087 A | 12/1990 | Sellwood et al. | |
| 4,980,898 A | 12/1990 | Silvian | |
| 4,992,919 A | 2/1991 | Lee et al. | |
| 4,994,952 A | 2/1991 | Silva et al. | |
| 5,001,620 A | 3/1991 | Smith | |
| 5,109,185 A | 4/1992 | Ball | |
| 5,121,079 A * | 6/1992 | Dargatz | 330/258 |
| 5,206,540 A | 4/1993 | de Sa e Silva et al. | |
| 5,264,780 A | 11/1993 | Bruer et al. | |
| 5,278,490 A | 1/1994 | Smedley | |
| 5,323,157 A | 6/1994 | Ledzius et al. | |
| 5,359,180 A | 10/1994 | Park et al. | |
| 5,383,109 A | 1/1995 | Maksimovic et al. | |
| 5,424,932 A | 6/1995 | Inou et al. | |
| 5,477,481 A | 12/1995 | Kerth | |
| 5,479,333 A | 12/1995 | McCambridge et al. | |
| 5,481,178 A | 1/1996 | Wilcox et al. | |
| 5,565,761 A | 10/1996 | Hwang | |
| 5,589,759 A | 12/1996 | Borgato et al. | |
| 5,638,265 A | 6/1997 | Gabor | |
| 5,691,890 A | 11/1997 | Hyde | |
| 5,747,977 A | 5/1998 | Hwang | |
| 5,757,635 A | 5/1998 | Seong | |
| 5,764,039 A | 6/1998 | Choi et al. | |
| 5,781,040 A | 7/1998 | Myers | |
| 5,783,909 A | 7/1998 | Hochstein | |
| 5,798,635 A | 8/1998 | Hwang et al. | |
| 5,900,683 A | 5/1999 | Rinehart et al. | |
| 5,929,400 A | 7/1999 | Colby et al. | |
| 5,946,202 A | 8/1999 | Balogh | |
| 5,946,206 A | 8/1999 | Shimizu et al. | |
| 5,952,849 A | 9/1999 | Haigh et al. | |
| 5,960,207 A | 9/1999 | Brown | |
| 5,963,086 A | 10/1999 | Hall | |
| 5,966,297 A | 10/1999 | Minegishi | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,181,114 B1 | 1/2001 | Hemena et al. | |
| 6,211,626 B1 | 4/2001 | Lys et al. | |
| 6,211,627 B1 | 4/2001 | Callahan | |
| 6,229,271 B1 | 5/2001 | Liu | |
| 6,229,292 B1 | 5/2001 | Redl et al. | |
| 6,246,183 B1 | 6/2001 | Buonavita | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,343,026 B1 | 1/2002 | Perry | |
| 6,344,811 B1 | 2/2002 | Melanson | |
| 6,385,063 B1 | 5/2002 | Sadek et al. | |
| 6,407,691 B1 | 6/2002 | Yu | |
| 6,441,558 B1 | 8/2002 | Muthu et al. | |
| 6,445,600 B2 | 9/2002 | Ben-Yaakov | |
| 6,452,521 B1 | 9/2002 | Wang | |
| 6,469,484 B2 | 10/2002 | L'Hermite et al. | |
| 6,495,964 B1 | 12/2002 | Muthu et al. | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,628,106 B1 | 9/2003 | Batarseh et al. | |
| 6,636,003 B2 | 10/2003 | Rahm et al. | |
| 6,646,848 B2 | 11/2003 | Yoshida et al. | |
| 6,688,753 B2 | 2/2004 | Calon et al. | |
| 6,713,974 B2 | 3/2004 | Patchornik et al. | |
| 6,724,174 B1 | 4/2004 | Esteves et al. | |
| 6,727,832 B1 | 4/2004 | Melanson | |
| 6,737,845 B2 | 5/2004 | Hwang | |
| 6,741,123 B1 | 5/2004 | Andersen et al. | |
| 6,753,661 B2 | 6/2004 | Muthu et al. | |
| 6,756,772 B2 | 6/2004 | McGinnis | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,873,065 B2 | 3/2005 | Haigh et al. | |
| 6,882,552 B2 | 4/2005 | Telefus et al. | |
| 6,888,322 B2 | 5/2005 | Dowling et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,958,920 B2 | 10/2005 | Mednik et al. | |
| 6,963,496 B2 | 11/2005 | Bimbaud | |
| 6,967,448 B2 | 11/2005 | Morgan et al. | |
| 6,970,503 B1 | 11/2005 | Kalb | |
| 6,975,079 B2 | 12/2005 | Lys et al. | |
| 6,975,523 B2 | 12/2005 | Kim et al. | |
| 6,980,446 B2 | 12/2005 | Simada et al. | |
| 7,003,023 B2 | 2/2006 | Krone et al. | |
| 7,034,611 B2 * | 4/2006 | Oswal et al. | 330/69 |
| 7,050,509 B2 | 5/2006 | Krone et al. | |
| 7,064,498 B2 | 6/2006 | Dowling et al. | |
| 7,064,531 B1 | 6/2006 | Zinn | |
| 7,075,329 B2 | 7/2006 | Chen et al. | |
| 7,078,963 B1 | 7/2006 | Andersen et al. | |
| 7,088,059 B2 | 8/2006 | McKinney et al. | |
| 7,102,902 B1 | 9/2006 | Brown et al. | |
| 7,106,603 B1 | 9/2006 | Lin et al. | |
| 7,109,791 B1 | 9/2006 | Epperson et al. | |
| 7,126,288 B2 | 10/2006 | Ribarich et al. | |
| 7,135,824 B2 | 11/2006 | Lys et al. | |
| 7,145,295 B1 | 12/2006 | Lee et al. | |
| 7,158,633 B1 | 1/2007 | Hein | |
| 7,161,816 B2 | 1/2007 | Shytenberg et al. | |
| 7,183,957 B1 | 2/2007 | Melanson | |
| 7,221,130 B2 | 5/2007 | Ribeiro et al. | |
| 7,233,135 B2 | 6/2007 | Noma et al. | |
| 7,246,919 B2 | 7/2007 | Porchia et al. | |
| 7,255,457 B2 | 8/2007 | Ducharm et al. | |
| 7,266,001 B1 | 9/2007 | Notohamiprodjo et al. | |
| 7,288,902 B1 | 10/2007 | Melanson | |
| 7,292,013 B1 | 11/2007 | Chen et al. | |
| 7,310,244 B2 | 12/2007 | Yang et al. | |
| 7,345,458 B2 | 3/2008 | Kanai et al. | |
| 7,375,476 B2 | 5/2008 | Walter et al. | |
| 7,388,764 B2 | 6/2008 | Huynh et al. | |
| 7,394,210 B2 | 7/2008 | Ashdown | |
| 7,511,437 B2 | 3/2009 | Lys et al. | |
| 7,538,499 B2 | 5/2009 | Ashdown | |
| 7,545,130 B2 | 6/2009 | Latham | |
| 7,554,473 B2 | 6/2009 | Melanson | |
| 7,569,996 B2 | 8/2009 | Holmes et al. | |
| 7,583,136 B2 * | 9/2009 | Pelly | 327/551 |
| 7,656,103 B2 | 2/2010 | Shteynberg et al. | |
| 7,710,047 B2 | 5/2010 | Shteynberg et al. | |
| 7,719,248 B1 | 5/2010 | Melanson | |
| 7,746,043 B2 | 6/2010 | Melanson | |
| 7,746,671 B2 | 6/2010 | Radecker et al. | |
| 7,750,738 B2 * | 7/2010 | Bach | 330/278 |
| 7,804,256 B2 | 9/2010 | Melanson | |
| 2002/0145041 A1 | 10/2002 | Muthu et al. | |
| 2002/0150151 A1 | 10/2002 | Krone et al. | |
| 2002/0166073 A1 | 11/2002 | Nguyen et al. | |
| 2003/0095013 A1 | 5/2003 | Melanson et al. | |
| 2003/0174520 A1 | 9/2003 | Bimbaud | |
| 2003/0223255 A1 | 12/2003 | Ben-Yaakov | |
| 2004/0004465 A1 | 1/2004 | McGinnis | |
| 2004/0046683 A1 | 3/2004 | Mitamura et al. | |
| 2004/0085030 A1 | 5/2004 | Laflamme et al. | |
| 2004/0085117 A1 | 5/2004 | Melbert et al. | |
| 2004/0169477 A1 | 9/2004 | Yanai et al. | |
| 2004/0227571 A1 | 11/2004 | Kuribayashi | |
| 2004/0228116 A1 | 11/2004 | Miller et al. | |
| 2004/0232971 A1 | 11/2004 | Kawasake et al. | |
| 2004/0239262 A1 | 12/2004 | Ido et al. | |
| 2005/0057237 A1 | 3/2005 | Clavel | |
| 2005/0156770 A1 | 7/2005 | Melanson | |

| | | |
|---|---|---|
| 2005/0168492 A1 | 8/2005 | Hekstra et al. |
| 2005/0184895 A1 | 8/2005 | Petersen et al. |
| 2005/0207190 A1 | 9/2005 | Gritter |
| 2005/0218838 A1 | 10/2005 | Lys |
| 2005/0253533 A1 | 11/2005 | Lys et al. |
| 2005/0270813 A1 | 12/2005 | Zhang et al. |
| 2005/0275354 A1 | 12/2005 | Hausman, Jr. et al. |
| 2005/0275386 A1 | 12/2005 | Jepsen et al. |
| 2006/0022916 A1 | 2/2006 | Aiello |
| 2006/0023002 A1 | 2/2006 | Hara et al. |
| 2006/0125420 A1 | 6/2006 | Boone et al. |
| 2006/0214603 A1 | 9/2006 | Oh et al. |
| 2006/0226795 A1 | 10/2006 | Walter et al. |
| 2006/0238136 A1 | 10/2006 | Johnson, III et al. |
| 2006/0261754 A1 | 11/2006 | Lee |
| 2006/0285365 A1 | 12/2006 | Huynh et al. |
| 2007/0024213 A1 | 2/2007 | Shteynberg et al. |
| 2007/0029946 A1 | 2/2007 | Yu et al. |
| 2007/0040512 A1 | 2/2007 | Jungwirth et al. |
| 2007/0053182 A1 | 3/2007 | Robertson |
| 2007/0103949 A1 | 5/2007 | Tsuruya |
| 2007/0124615 A1 | 5/2007 | Orr |
| 2007/0182699 A1 | 8/2007 | Ha et al. |
| 2008/0012502 A1 | 1/2008 | Lys |
| 2008/0043504 A1 | 2/2008 | Ye et al. |
| 2008/0054815 A1 | 3/2008 | Kotikalapoodi et al. |
| 2008/0130322 A1 | 6/2008 | Artusi et al. |
| 2008/0174291 A1 | 7/2008 | Hansson et al. |
| 2008/0174372 A1 | 7/2008 | Tucker et al. |
| 2008/0175029 A1 | 7/2008 | Jung et al. |
| 2008/0192509 A1 | 8/2008 | Dhuyvetter et al. |
| 2008/0224635 A1 | 9/2008 | Hayes |
| 2008/0232141 A1 | 9/2008 | Artusi et al. |
| 2008/0239764 A1 | 10/2008 | Jacques et al. |
| 2008/0259655 A1 | 10/2008 | Wei et al. |
| 2008/0278132 A1 | 11/2008 | Kesterson et al. |
| 2009/0067204 A1 | 3/2009 | Ye et al. |
| 2009/0147544 A1 | 6/2009 | Melanson |
| 2009/0174479 A1* | 7/2009 | Yan et al. ................... 330/252 |
| 2009/0218960 A1 | 9/2009 | Lyons et al. |

FOREIGN PATENT DOCUMENTS

| | | |
|---|---|---|
| EP | 0910168 A1 | 4/1999 |
| EP | 1014563 | 6/2000 |
| EP | 1164819 A | 12/2001 |
| EP | 1213823 A2 | 6/2002 |
| EP | 1528785 A | 5/2005 |
| EP | 2204905 A1 | 12/2009 |
| EP | 2204905 A1 | 7/2010 |
| GB | 2069269 A | 8/1981 |
| JP | WO 2006/022107 A2 | 3/2006 |
| WO | 01/15316 A1 | 1/2001 |
| WO | WO0115316 A1 | 3/2001 |
| WO | 01/97384 A | 12/2001 |
| WO | 02/15386 A2 | 2/2002 |
| WO | WO0215386 A2 | 2/2002 |
| WO | WO0227944 | 4/2002 |
| WO | 02/091805 A2 | 11/2002 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

Dustin Rand et al: "Issues, Models and Solutions for Triac Modulated Phase Dimming of LED Lamps" Power Electronics Specialists Confernece, 2007. PESC 2007. IEEE, IEEE, p. 1, Jun. 1, 2007, pp. 1398-1404.
Spiazzi G et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.
International Search Report PCT/US2008/062381 dated Feb. 5, 2008.
International Search Report PCT/US2008/056739 dated Dec. 3, 2008.
Written Opinion of the International Searching Authority PCT/US2008/062381 dated Feb. 5, 2008.
Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.
International Search Report PCT/US2008/062398 dated Feb. 5, 2008.
Partial International Search Report PCT/US2008/062387 dated Feb. 5, 2008.
Noon, Jim "UC3855A/B High Performance Power Factor Preregulator", Texas Instruments, SLUA146A, May 1996, Revised Apr. 2004.
Linear Technology, "Single Switch PWM Controller with Auxiliary Boost Converter," LT1950 Datasheet, Linear Technology, Inc. Milpitas, CA, 2003.
Yu, Zhenyu, 3.3V DSP for Digital Motor Control, Texas Instruments, Application Report SPRA550 dated Jun. 1999.
International Rectifier, Data Sheet No. PD60143-O, Current Sensing Single Channel Driver, El Segundo, CA, dated Sep. 8, 2004.
Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt/://focus.ti.com/lit/ml/slup169/slup169.pdf the whole document.
ST Datasheet L6562, Transition-Mode PFC Controller, 2005, STMicroelectronics, Geneva, Switzerland.
Maksimovic, Regan Zane and Robert Erickson, Impact of Digital Control in Power Electronics, Proceedings of 2004 International Symposium on Power Semiconductor Devices & Ics, Kitakyushu, , Apr. 5, 2010, Colorado Power Electronics Center, ECE Department, University of Colorado, Boulder, CO.
"HV9931 Unity Power Factor LED Lamp Driver, Initial Release" 2005, SUPERTEX Inc., Sunnyvale, CA USA.
International Search Report PCT/GB2006/003259 dated Jan. 12, 2007.
Written Opinion of the International Searching Authority PCT/US2008/056739.
International Search Report PCT/US2008/056606 dated Dec. 3, 2008.
Written Opinion of the International Searching Authority PCT/US2008/056606 dated Dec. 3, 2008.
International Search Report PCT/US2008/056608 dated Dec. 3, 2008.
Written Opinion of the International Searching Authority PCT/US2008/056608 dated Dec. 3, 2008.
International Search Report PCT/GB2005/050228 dated Mar. 14, 2006.
International Search PCT/US2008/062387 dated Jan. 10, 2008.
Data Sheet LT3496 Triple Output LED Driver, 2007, Linear Technology Corporation, Milpitas, CA.
News Release, Triple Output LED, LT3496.
Analog Devices, 120 kHz Bandwidth, Low Distortion, Isolation Amplifier, AD215, Rev. 0, 1996.
Burr-Brown Products From Texas Instruments, Precision Low Cost Isolation Amplifier, ISO120/121, 1988.
Burr-Brown From Texas Instruments, High IMR, Low Cost Isolation Amplifier, ISO130, SBOS220, Oct. 2001.
Texas Instruments, Data Sheet entitled High-Speed, Low Noise, Fully-Differential I/O Amplifiers, THS4130, THS4131, SLOS318F, May 2000, Revised Jan. 2006.
Extended European Search Report and Search Opinion for EP Application No. 09180901.2, dated Apr. 19, 2010.
Texas Instruments, Interleaving Continuous Conduction Mode PFC Controller, UCC28070, SLUS794C, Nov. 2007, revised Jun. 2009, Texas Instruments, Dallas TX.
Power Integrations, Inc., "TOP200-4/14 TOPSwitch Family Three-terminal Off-line PWM Switch", XP-002524650, Jul. 1996, Sunnyvale, California.
Texas Instruments, SLOS318F, "High-Speed, Low Noise, Fully-Differential I/O Amplifiers," THS4130 and THS4131, US, Jan. 2006.
International Search Report and Written Opinion, PCT US20080062387, dated Feb. 5, 2008.
International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.
Prodic, Aleksandar, "Digital Controller for High-Frequency Rectifiers with Power Factor Correction Suitable for On-Chip Implementation," IEEE, US, 2007.
International Search Report and Written Opinion, PCT US20080062378, dated Feb. 5, 2008.
International Search Report and Written Opinion, PCT US20090032351, dated Jan. 29, 2009.
Erickson, Robert W. et al, "Fundamentals of Power Electronics," Second Edition, Chapter 6, Boulder, CO, 2001.
Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.
Texas Instruments, SLUS828B, "8-Pin Continuous Conduction Mode (CCM) PFC Controller", UCC28019A, US, revised Apr. 2009.
Analog Devices, "120 kHz Bandwidth, Low Distortion, Isolation Amplifier", AD215, Norwood, MA, 1996.
Burr-Brown, ISO120 and ISO121, "Precision Los Cost Isolation Amplifier," Tucson AZ, Mar. 1992.
Burr-Brown, ISO130, "High IMR, Low Cost Isolation Amplifier," SBOS220, US, Oct. 2001.
International Search Report and Written Report PCT US20080062428 dated Feb. 5, 2008.
Prodic, A. et al, "Dead Zone Digital Controller for Improved Dynamic Response of Power Factor Preregulators," IEEE, 2003.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al., International Rectifier, Bridgeless PFC Implementation Using One Cycle Control Technique, 2005.
Linear Technology, LT1248, Power Factor Controller, Apr. 20, 2007.
On Semiconductor, AND8123/D, Power Factor Correction Stages Operating in Critical Conduction Mode, Sep. 2003.
On Semiconductor, MC33260, GreenLine Compact Power Factor Controller: Innovative Circuit for Cost Effective Solutions, Sep. 2005.
On Semiconductor, NCP1605, Enhanced, High Voltage and Efficient Standby Mode, Power Factor Controller, Feb. 2007.
On Semconductor, NCP1606, Cost Effective Power Factor Controller, Mar. 2007.
On Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
Stmicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.

Texas Instruments, Transition Mode PFC Controller, SLUS515D, Jul. 2005.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al., Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23, 1997-Feb. 27, 1997.
L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.
Fairchild Semiconductor, Application Note 42030, Theory and Application of the ML4821 Average Current Mode PFC Controller, Oct. 25, 2000.
Unitrode Products From Texas Instruments, BiCMOS Power Factor Preregulator, Feb. 2006.
D. Hausman, Lutron, RTISS-TE Operation, Real-Time Illumination Stability Systems for Trailing-Edge (Reverse Phase Control) Dimmers, v. 1.0 Dec. 2004.
International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.
Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, Linear Technology, 2006.
Fairchild Semiconductor, FAN7544, Simple Ballast Controller, Rev. 1.0.0, 2004.
Fairchild Semiconductor, FAN7532, Ballast Controller, Rev. 1.0.2, Jun. 2006.
Fairchild Semiconductor, FAN7711, Ballast Control IC, Rev. 1.0.2, Mar. 2007.
Fairchild Semiconductor, KA7541, Simple Ballast Controller, Rev. 1.0.3, 2001.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transactions on Power Electronics, vol. 22, No. 5, Sep. 2007.
M. Brkovic et al., "Automatic Current Shaper with Fast Output Regulation and Soft-Switching," S.15.C Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.
J. Qian et al., Charge Pump Power-Factor-Correction Technologies Part II: Ballast Applications, IEEE Transactions on Power Electronics, vol. 15, No. 1, Jan. 2000.
Chromacity Shifts in High-Power White LED Systems due to Different Dimming Methods, Solid-State Lighting, http://www.lrc.rpi.edu/programs/solidstate/completedProjects.asp?ID=76, printed May 3, 2007.
S. Chan et al., Design and Implementation of Dimmable Electronic Ballast Based on Integrated Inductor, IEEE Transactions on Power Electronics, vol. 22, No. 1, Jan. 2007.
M. Madigan et al., Integrated High-Quality Rectifier-Regulators, IEEE Transactions on Industrial Electronics, vol. 46, No. 4, Aug. 1999.
T. Wu et al., Single-Stage Electronic Ballast with Dimming Feature and Unity Power Factor, IEEE Transactions on Power Electronics, vol. 13, No. 3, May 1998.
F. Tao et al., "Single-Stage Power-Factor-Correction Electronic Ballast with a Wide Continuous Dimming Control for Fluorescent Lamps," IEEE Power Electronics Specialists Conference, vol. 2, 2001.
Azoteq, IQS17 Family, IQ Switch®—ProxSense™ Series, Touch Sensor, Load Control and User Interface, IQS17 Datasheet V2.00.doc, Jan. 2007.
C. Dilouie, Introducing the LED Driver, EC&M, Sep. 2004.
S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.
International Search Report for PCT/US2008/051072, mailed Jun. 4, 2008.
Mamano, Bob, "Current Sensing Solutions for Power Supply Designers", Unitrode Seminar Notes SEM1200, 1999.
http://toolbarpdf.com/docs/functions-and-features-of-inverters.html printed on Jan. 20, 2011.
"HV9931 Unity Power Factor LED Lamp Driver, Initial Release" 2005, SUPERTEX Inc., Sunnyvale, CA USA.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEETransactions on Power Electronics, vol. 8, No. 4, Oct. 1993.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/sayskogs/pub/A_Proposed_Stability_Characterization.pdf.
J. Turchi, Four Key Steps to Design a Continuous Conduction Mode PFC Stage Using the NCP1653, ON Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

Why Different Dimming Ranges? The Difference Between Measured and Perceived Light, 2000 http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

St Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

* cited by examiner

ELECTRONIC SYSTEM HAVING COMMON MODE VOLTAGE RANGE ENHANCEMENT

BACKGROUND OF THE INVENTION

1. Field of the Invention

The present invention relates in general to the field of signal processing, and more specifically to an electronic system having common mode voltage range enhancement.

2. Description of the Related Art

Electronic systems often include amplifiers to amplify one or more signals. FIG. 1 depicts an embodiment of an electronic data acquisition system 100 that includes an amplifier 102. Signal source is, for example, a transducer that senses a physical event, such as a seismic event, and generates differential input signals $V_{INS+}$ and $V_{INS-}$ that represent the physical event. Signal source 103 is connected to amplifier 102 via cables 108 and 109. In seismic exploration environments, the physical events can be the detection of ground vibrations. Additionally, in some applications, such as in a seismic exploration environment, cables 108 and 109 can be, for example, 40 ft-150 ft long. Electrostatic and/or electromagnetic sources in the vicinity of cables 108 and 109 can induce an undesirable common mode voltage $V_{CM}$ in the cables 108 and 109. The differential input signals $V_{INS+}$ and $V_{INS-}$ are then superimposed on the common mode voltage $V_{CM}$ to generate respective input signals $V_{IN+}$ and $V_{IN-}$. Thus, the input signal $V_{IN+}$ includes two components, i.e. signal $V_{INS+}$ and the common mode voltage $V_{CM}$. Likewise, input signal $V_{IN-}$ includes two components, i.e. signal $V_{INS-}$ and the common mode voltage $V_{CM}$. Input signal $V_{IN+}=V_{CM}+V_{INS+}$, and input signal $V_{IN-}=V_{CM}+V_{INS-}$. Because input signals $V_{INS+}$ and $V_{INS-}$ are differential signals, $V_{INS+}=-V_{INS-}$, i.e. signal $V_{INS+}$ is an opposite polarity equivalent of signal $V_{INS-}$.

Amplifier 102 receives input signals $V_{IN+}$ and $V_{IN-}$. Amplifier 102 is generally designed to reject the common mode voltage $V_{CM}$, amplify the differential input signals $V_{INS+}$ and $V_{INS-}$, and generate differential output signals $V_{OUT+}$ and $V_{OUT-}$. In at least one embodiment, $V_{INS+}=-V_{INS-}$ and $V_{OUT+}=V_{OUT-}$. The output signals $V_{OUT+}$ and $V_{OUT-}$ can be used in many applications, such as input signals to an analog-to-digital converter (ADC) 104. The ADC 104 generates a digital output signal y(n) that represents the difference between input signals $V_{IN+}$ and $V_{IN-}$. Amplifier 102 operates from two, fixed supply voltage rails $V_{H+}$ and $V_{H-}$. A fixed voltage supply 106 generates the two fixed, supply voltage rails $V_{H+}$ and $V_{H-}$. The supply voltage rails $V_{H+}$ and $V_{H-}$ are set to accommodate the maximum and minimum excursions of $V_{IN+}$ and $V_{IN-}$.

FIG. 2A depicts an exemplary voltage plot 200A associated with operation of amplifier 102 and common mode voltage $V_{CM}$. Referring to FIGS. 1 and 2A, exemplary input signals $V_{IN+}$ and $V_{IN-}$ vary over time and have respective maximum and minimum voltages of $maxV_{IN}$ and $minV_{IN}$. "$V_{IN}$" represents $V_{IN+}$ and $V_{IN-}$ unless otherwise indicated. To prevent distortion of output signal $V_{OUT+}$ and $V_{OUT-}$, the values of fixed supply voltages $V_{H+}$ and $V_{H-}$ are set so that $V_{H+}$ is at least equal to the greater of ($maxV_{CM}+V_{IN\_PP}/2$), and $V_{H-}$ is less than or equal to ($minV_{CM}-V_{IN\_PP}/2$). $V_{IN\_PP}$ is the peak-to-peak voltage of input signals $V_{IN+}$ and $V_{IN-}$. "$maxV_{CM}$" is the maximum anticipated value of the common mode voltage $V_{CM}$, and $minV_{CM}$ is the minimum anticipated value of the common mode voltage $V_{CM}$. The supply voltages $V_{H+}$ and $V_{H-}$ are set to account for both the maximum and minimum excursions of input signal voltages $V_{IN+}$ and $V_{IN-}$.

FIG. 2B depicts a time varying voltage plot 200B of input signals $V_{IN+}$ and $V_{IN-}$ having common mode voltage $V_{CM}$ superimposed on respective differential signals $V_{INS+}$ and $V_{INS-}$. In at least one embodiment, the maximum and minimum values of common mode voltage $V_{CM}$ is several times larger than the peak voltages of differential input $V_{INS+}$ and $V_{INS-}$. Power must be allocated to accommodate the common mode portion of the input signals to amplifier 102. For example, the common mode voltage can be relatively large, such as $-10V<V_{CM}<+10V$ and the differential signals $V_{INS+}$ and $V_{INS-}$ have voltages that can be relatively small, such as +/−100 millivolts to, for example, +/−2.5 V. For a +/−10 V maximum/minimum common mode voltage $V_{CM}$ and +/−2.5 V maximum/minimum differential signals $V_{INS+}$ and $V_{INS-}$, the power requirements of amplifier 102 are P=I·(+/−12.5 V). "P" is the power supplied by fixed voltage supply 106, and "I" is the current supplied by fixed voltage supply 106.

Supplying power to accommodate the common mode voltage $V_{CM}$ when the differential signals are relatively small is generally inefficient and requires components with higher operational power limits. Higher operational power components generally trade off cost with accuracy.

SUMMARY OF THE INVENTION

In one embodiment of the present invention, an apparatus includes a circuit to generate a floating first supply voltage, wherein during operation of the circuit the first supply voltage tracks a common mode voltage of first and second input signals.

In another embodiment of the present invention, a method includes generating a floating first supply voltage that tracks a common mode voltage of first and second input signals. The method further includes providing the first supply voltage to a first circuit.

In a further embodiment of the present invention, an apparatus includes a common mode voltage detector to detect a common mode voltage of first and second input signals. The apparatus further includes a floating supply voltage generator to generate a first floating supply voltage and a second floating supply voltage, wherein the first and second floating supply voltages track the common mode voltage and the first floating supply voltage and second floating supply voltage are equivalent polar opposites. The apparatus also includes a first amplifier configured to receive the first and second floating supply voltages and to amplify the first input signal to generate a first amplified input signal. The apparatus additionally includes a second amplifier configured to receive the first and second floating supply voltages and to amplify the second input signal to generate a second amplified input signal and an analog-to-digital converter to convert a difference between the first and second amplified input signals into a digital signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
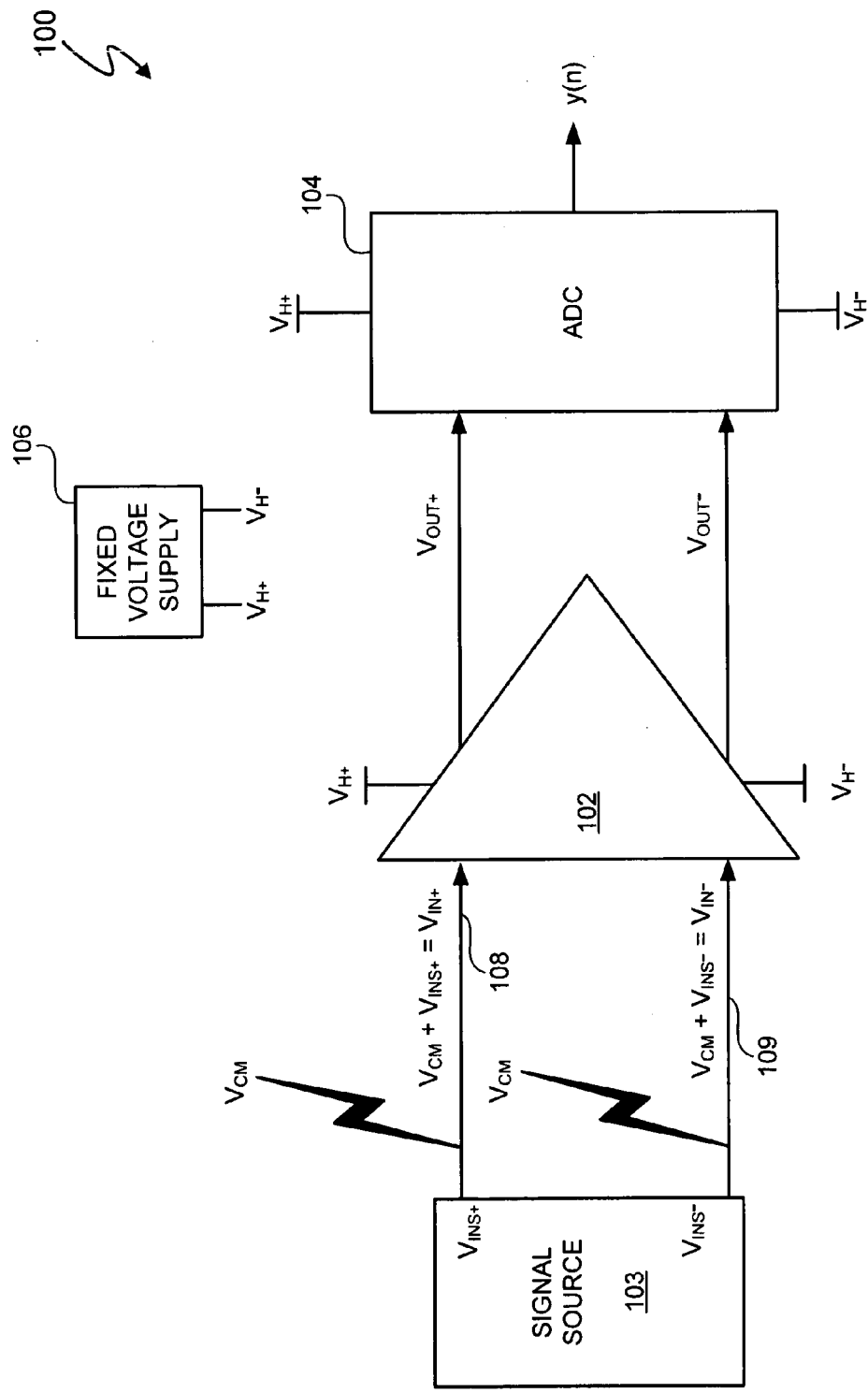
FIG. 1 (labeled prior art) depicts an electronic system with an amplifier operating from fixed supply voltages.
Figure 2A:
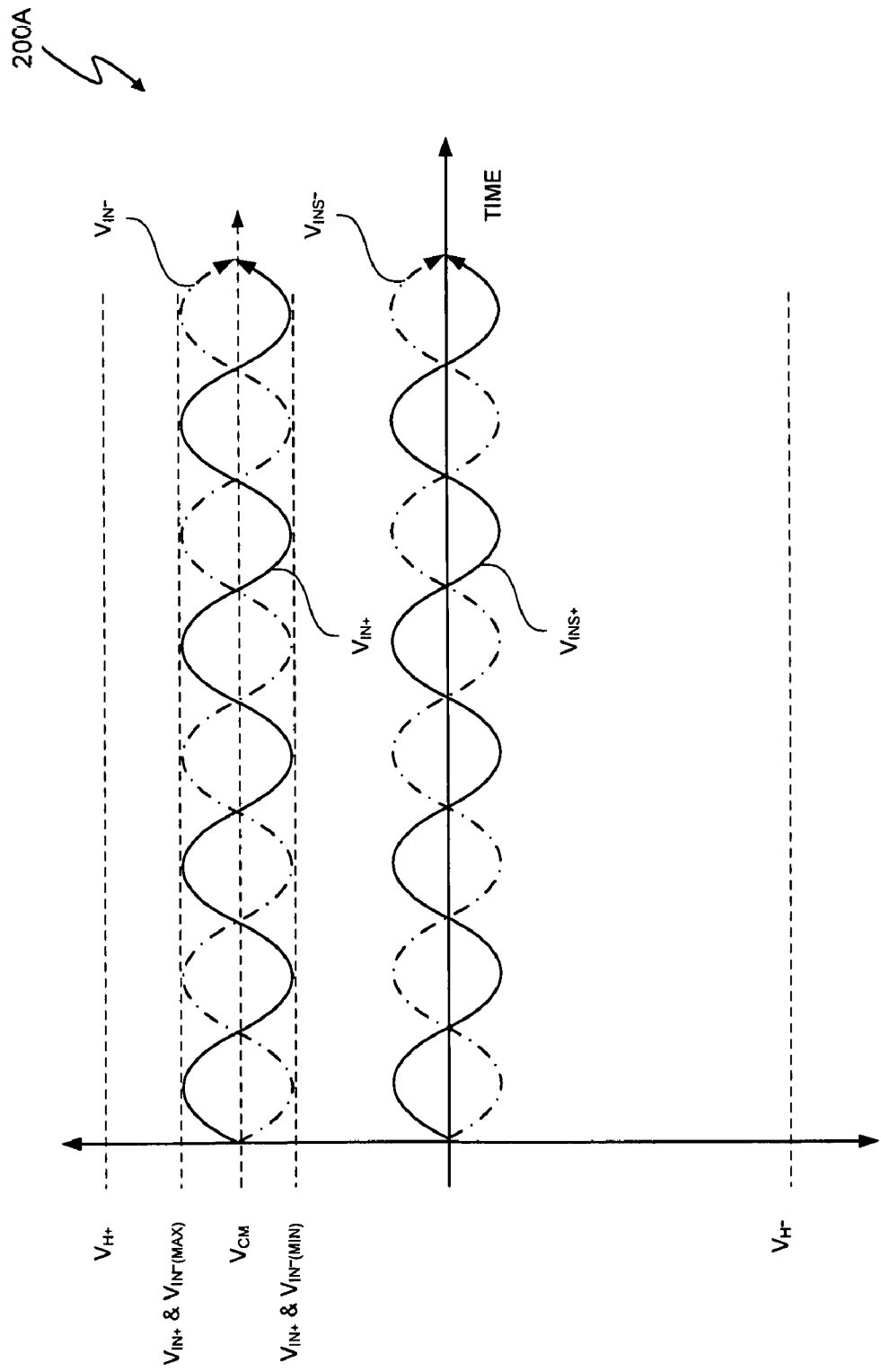
FIGS. 2A and 2B (labeled prior art) depict a relationship between the fixed supply voltages and the common mode voltage affected input signals to the electronic system of FIG. 1.
Figure 2B:
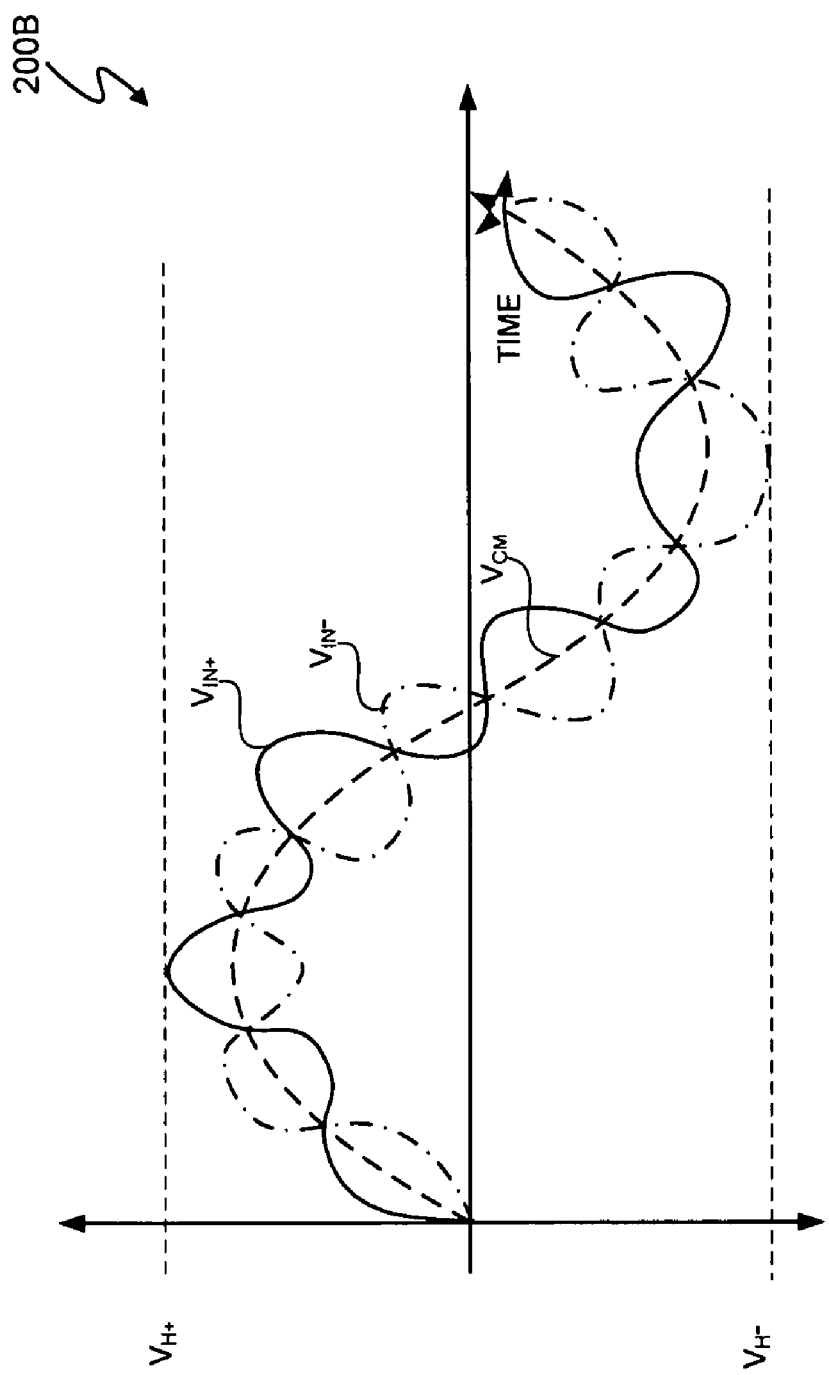

In at least one embodiment, an electronic system generates at least one floating supply voltage, wherein during operation of the circuit the floating supply voltage tracks a common mode voltage of first and second input signals. By tracking the common mode voltage, in at least one embodiment, the floating supply voltage adjusts as the common mode voltage changes. Thus, in at least one embodiment, the floating supply voltages can be based upon the peak-to-peak values of the first and second output signals without factoring in the common mode voltage. By floating the supply voltages and referencing the supply voltages to the common mode voltage, the common mode voltage can be rejected without allocating power to process the common mode voltage. In other words, in at least one embodiment, power levels are established based on the signal portion of the input signals and not by the common mode voltage. Additionally, in at least one embodiment, the input signals are sampled differentially prior to subsequent processing by an analog-to-digital converter so that the common mode signal is not digitized.

In at least one embodiment, the voltage rails of the floating supply voltage are approximately equal to one-half of the maximum peak-to-peak value of the first and second output signals regardless of the value of the common mode voltage. In at least one embodiment, the electronic system generates positive and negative floating supply voltages that track the common mode voltage of the first and second input signals and provides the floating supply voltages to at least one amplifier, such as a differential amplifier.

In at least one embodiment, the electronic system detects the common mode voltage of the first and second input signals and generates each floating supply voltage using a power transfer circuit referenced to the common mode voltage. One or more amplifiers operate from the floating supply voltages and receive the first and second input signals. The floating supply voltages track the common mode voltage. In at least one embodiment, two amplifiers each generate a respective output signal that tracks the input signal to the respective amplifier. An analog-to-digital converter (ADC) converts a difference between the output signals into a digital signal. The ADC and the amplifiers can operate from lower supply voltages that are substantially independent from the common mode voltage of the input signals. By operating from lower supply voltages, such as +/−2.5 V (i.e. 5V), in at least one embodiment, standard, high quality components can be used in place of higher voltage, lower quality components. Thus, the electronic system can efficiently provide common mode range enhancement by, for example, operating devices using supply voltages that are less than the largest common mode voltage plus maximum peak-to-peak signal voltage.

The ADC includes a switched capacitor network to alternately couple the input signals to respective sampling capacitors and alternatively couple the sampling capacitors to a second circuit to, for example, complete the analog-to-digital conversion of the input signals. In at least one embodiment, the switched capacitor network substantially translates the common mode voltage of the input signals to a lower common mode voltage of the ADC.

Figure 3:
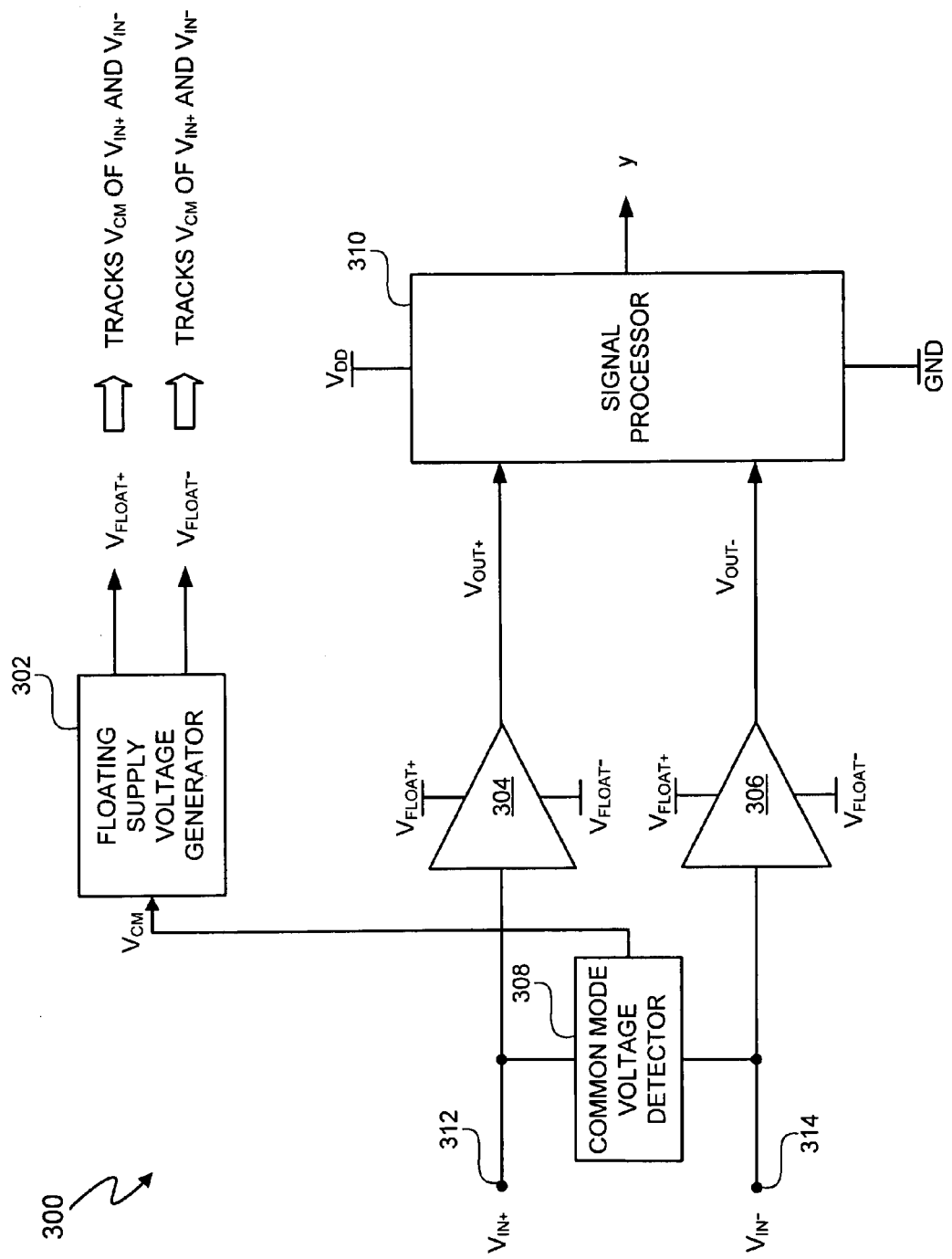
FIG. 3 depicts an electronic system having floating supply voltages.

FIG. 3 depicts an electronic system 300 that includes floating supply voltage generator 302 to generate floating supply voltages $V_{FLOAT+}$ and $V_{FLOAT-}$ that track a common mode voltage $V_{CM}$ of input signals $V_{IN+}$ and $V_{IN-}$. The common mode voltage $V_{CM}$ can be generated in any number of ways, such as inducement by electrostatic and/or electromagnetic sources in the vicinity of conductors connected to input nodes 312 and 314 of respective amplifiers 304 and 306. Exemplary conductors are cables 108 and 109 (FIG. 1). Electronic system 300 receives input signals $V_{IN+}$ and $V_{IN-}$. The input signals $V_{IN+}$ and $V_{IN-}$ can be generated by any source, such as signal source 103 (FIG. 1). In at least one embodiment, the input signals $V_{IN+}$ and $V_{IN-}$ include respective differential signals $V_{INS+}$ and $V_{INS-}$ that are generated by a sensor that senses seismic activity in, for example, oil and gas exploration operations. In at least one embodiment, signals $V_{INS+}$ and $V_{INS-}$ are differential signals, i.e. signal $V_{INS+}$ is an opposite polarity equivalent of signal $V_{INS-}$ such that $V_{INS+}=-V_{INS-}$. In at least one embodiment, $V_{INS+}$ and $V_{INS-}$ are not differential signals. In at least one embodiment, the input signal $V_{IN+}=V_{CM}+V_{INS+}$, and the input signal $V_{IN-}=V_{CM}+V_{INS-}$. Amplifiers 304 and 306 receive respective input signals $V_{IN+}$ and $V_{IN-}$. Amplifiers 304 and 306 each receive and operate from floating supply voltages $V_{FLOAT+}$ and $V_{FLOAT-}$.

A common mode voltage detector 308 detects the common mode voltage $V_{CM}$ of input signals $V_{IN+}$ and $V_{IN-}$. The floating supply voltage generator 302 generates floating supply voltages $V_{FLOAT+}$ and $V_{FLOAT-}$ to track the common mode voltage $V_{CM}$. Thus, the floating supply voltages $V_{FLOAT+}$ and $V_{FLOAT-}$ are generated relative to the common mode voltage $V_{CM}$. In at least one embodiment, the floating supply voltage generator 302 also generates a fixed voltage $V_{DD}$. In at least one embodiment, to prevent distortion of output signals $V_{OUT+}$ and $V_{OUT-}$, the floating supply voltage generator 302 generates floating supply voltages $V_{FLOAT+}$ and $V_{FLOAT-}$ so that $V_{FLOAT+}=(V_{DD}+V_{CM})$ and $V_{FLOAT-}=(V_{CM}-V_{DD})$. The fixed voltage $V_{DD}$ can be set so that voltage $V_{DD}$ is greater than or equal to $(maxV_{OUT\_PP})/2$ but less than $[(maxV_{OUT\_PP})/2+maxV_{CM}]$. "$maxV_{OUT\_PP}$" represents the maximum peak-to-peak voltage of output signals $V_{OUT+}$ and $V_{OUT-}$.

Additionally, the fixed voltage $V_{DD}$ can be set so that voltage $V_{DD}$ is greater than or equal to $(maxV_{IN\_PP})/2$. "$maxV_{IN\_PP}$" represents the maximum peak-to-peak voltage of output signals $V_{IN+}$ and $V_{IN-}$. In at least one embodiment, floating supply voltages $V_{FLOAT+}$ and $V_{FLOAT-}$ are set to provide an operating margin to accommodate full-swing signal voltages plus operating voltages of components using floating supply voltages $V_{FLOAT+}$ and $V_{FLOAT-}$. Thus, in at least one embodiment, to prevent distortion of output signals $V_{OUT+}$ and $V_{OUT-}$, the floating supply voltage generator 302 generates floating supply voltages $V_{FLOAT+}$ and $V_{FLOAT-}$ so that $V_{FLOAT+}=(V_{DD}+V_{CM}+V_M)$ and $V_{FLOAT-}=(V_{CM}-V_{DD}-V_M)$. "$V_M$" represents the voltage margin that provides a sufficient margin to allow components, such as amplifiers 304 and 306 to operate. The voltage margin $V_M$ includes, for example, threshold voltages for field effect transistors of amplifiers 304 and 306.

Figure 4:
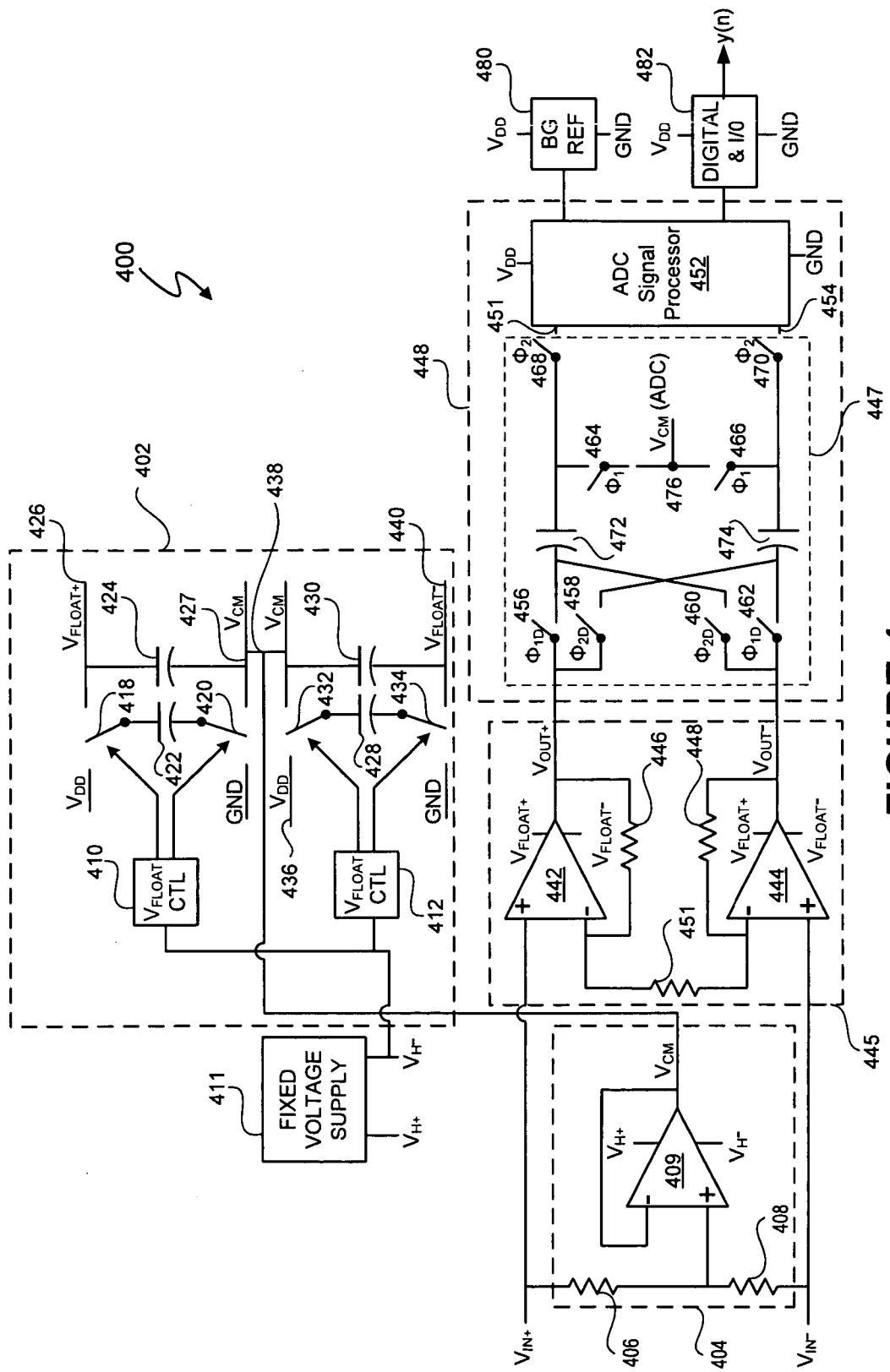
FIG. 4 depicts an embodiment of the electronic system of FIG. 3.
Figure 9:
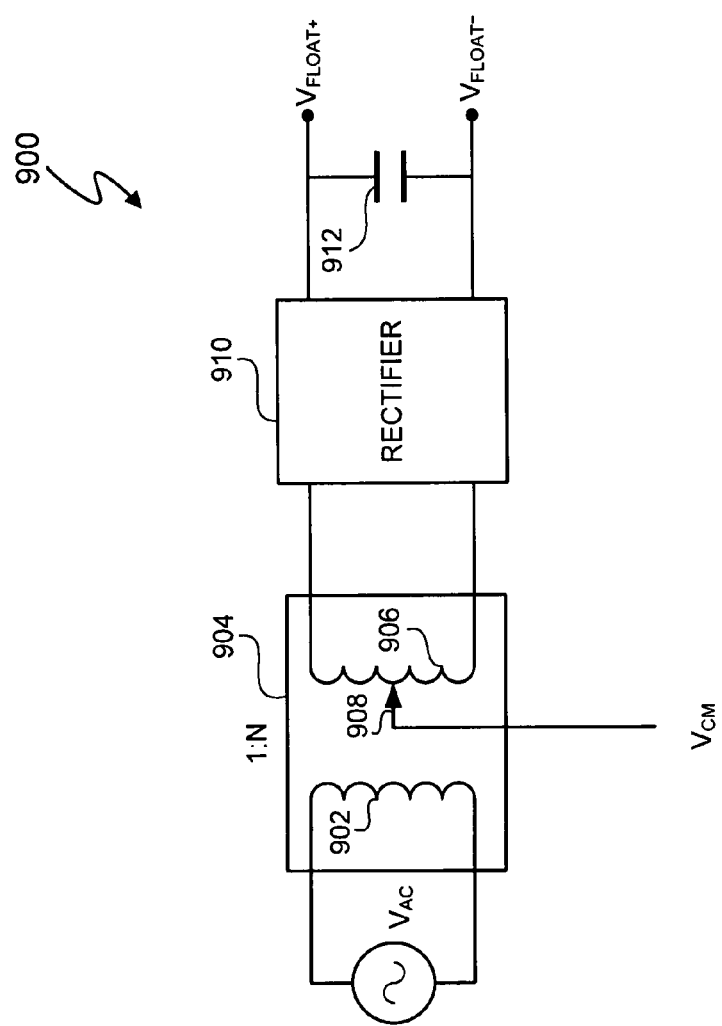
FIG. 9 depicts a floating power supply generator for the electronic system of FIG. 3.

The particular implementation of floating supply voltage generator 302 is a matter of design choice. In at least one embodiment, a switched capacitor, power transfer circuit transfers power from one set of capacitors to another while using common mode voltage $V_{CM}$ as a reference to generate floating voltages $V_{FLOAT+}$ and $V_{FLOAT-}$. FIG. 4 depicts an exemplary power transfer circuit using a switched capacitor network. In at least one embodiment, a power transfer circuit utilizes a transformer to transfer power and generate the floating voltages $V_{FLOAT+}$ and $V_{FLOAT-}$. FIG. 9 depicts an exemplary transformer-based power transfer circuit. Other circuits, such as a floating battery can also be used.

Output signals $V_{OUT+}$ and $V_{OUT-}$ respectively represent amplified input signals $V_{IN+}$ and $V_{IN-}$. "max$V_{CM}$" represents the maximum anticipated value of the common mode voltage $V_{CM}$. In at least one embodiment, if amplifiers 304 and 306 have unity gain, then $V_{OUT+}=V_{IN+}$ and $V_{OUT-}=V_{IN-}$. Thus, for unity gain, the fixed supply voltage $V_{DD}$ can be set so that the voltage value of fixed supply voltage $V_{DD}$ is greater than or equal to $(maxV_{IN\_PP})/2$ but less than $[(maxV_{IN\_PP})/2 + maxV_{CM}]$. "max$V_{IN\_PP}$" represents the maximum peak-to-peak voltage of input signals $V_{IN+}$ and $V_{IN-}$. For example, if output signals $V_{OUT+}$ and $V_{OUT-}$ have peak-to-peak voltages of 5V and $V_{CM}$ has maximum/minimum values of +/−10V, then $2.5 \leq V_{DD} \leq 12.5$. In at least one embodiment, fixed supply voltage $V_{DD}$ is equal to max$V_{OUT\_PP}/2$. For example, for amplifiers 304 and 306 with unity gain, if input signals $V_{IN+}$ and $V_{IN-}$ have maximum peak-to-peak values of 5V, voltage $V_{DD}=2.5$ V. Thus, since the floating supply voltages $V_{FLOAT+}$ and $V_{FLOAT-}$ track the common mode voltage $V_{CM}$, the fixed supply voltage $V_{DD}$ can be determined independently of the common mode voltage $V_{CM}$.

In at least one embodiment, for a common mode maximum voltage of +/−10V, signals $V_{INS+}$ and $V_{INS-}$ having a maximum voltage of +/−2.5 V (i.e. (max$V_{IN\_PP}$)/2=2.5V), $V_{FLOAT+}=(V_{DD}+V_{CM})$, $V_{FLOAT-}=(V_{CM}-V_{DD})$, and for unity gain amplifiers 304 and 306, the power P supplied to each of amplifiers 304 and 306 is $P=I \cdot (+/-2.5)$, where "I" is the current supplied to each of amplifiers 304 and 306. Thus, compared to amplifier 102 (FIG. 1), in at least one embodiment, amplifiers 304 and 306 use 80% less power. In at least one embodiment, the operating margin voltage $V_M$ is also factored into the power calculation (i.e. $V_{FLOAT+}=(V_{DD}+V_{CM}+V_M)$ and $V_{FLOAT-}=(V_{CM}-V_{DD}-V_M)$) such that $P=I \cdot (+/-max-V_{IN\_PP}+/-V_M)$. However, since $(V_{FLOAT+}-V_{FLOAT-})<(V_{H+}-V_{H-})$, $V_{INS+}+V_M<V_{H+}$ and $V_{INS-}-V_M>V_{H-}$. So, the power P supplied to each amplifier 304 and 306 is still less than the power supplied to amplifier 102 (FIG. 1).

The particular selection, configuration, and number of circuits receiving floating supply voltage $V_{FLOAT+}$, $V_{FLOAT-}$, or both $V_{FLOAT+}$ and $V_{FLOAT-}$ is a matter of design choice. The floating supply voltage is useful for virtually any circuit whose supply voltage is conventionally set to account for common mode voltage levels plus input signal voltage levels.

Amplifiers 304 and 306 generate respective output signals $V_{OUT+}$ and $V_{OUT-}$. Signal processor 310 receives output signals $V_{OUT+}$ and $V_{OUT-}$ and processes output signals $V_{OUT+}$ and $V_{OUT-}$ to generate output signal y(n). In at least one embodiment, signal processor 310 is an ADC.

FIG. 4 depicts electronic system 400, which represents one embodiment of electronic system 300. Electronic system 400 includes a floating supply voltage generator 402, which represents one embodiment of floating supply voltage generator 302. The floating supply voltage generator 402 generates floating supply voltages $V_{FLOAT+}$ and $V_{FLOAT-}$ to track the common mode voltage $V_{CM}$ of input signals $V_{IN+}$ and $V_{IN-}$. Common mode voltage detector 404, which represents one embodiment of common mode voltage detector 308, includes resistors 406 and 408. In at least one embodiment, signals $V_{INS+}$ and $V_{INS-}$ are differential signals, i.e. =signal $V_{INS+}$ is an opposite polarity equivalent of signal $V_{INS-}$ such that $V_{INS+}=-V_{INS-}$. Thus, by forming a voltage divider with matching resistors 406 and 408, the voltage at the junction of resistors 406 and 408 represents the common mode voltage $V_{CM}$. i.e. $V_{CM}=(V_{IN+}+V_{IN-})/2$. The exact value of resistance R is a matter of design choice and is, for example, 1 Mohm. The non-inverting input terminal of operational amplifier 409 receives the common mode voltage $V_{CM}$. Operational amplifier 409 is configured to provide unity gain so that the output of operational amplifier 409 is the common mode voltage $V_{CM}$.

Operational amplifier 409 operates from fixed supply voltages $V_{H+}$ and $V_{H-}$. In at least one embodiment, supply voltages $V_{H+}$ and $V_{H-}$ are respectively equal to $[(V_{OUT\_PP}+/2)+maxV_{CM}]$ and $-[(V_{OUT\_PP}+/2)+maxV_{CM}]$. In at least one embodiment, max$V_{CM}$ is 10V, $V_{OUT\_PP}$ is 5V, so $V_{H+}=12.5$V and $V_{H-}=-12.5$V. Operational amplifier 409 draws very little current. Thus, although the supply voltages $V_{H+}$ and $V_{H-}$ are relatively large compared to the peak-to-peak voltage levels of input signals $V_{IN+}$ and $V_{IN-}$, operational amplifier 409 dissipates very little power. Additionally, operational amplifier 409 can be a simple design. In at least one embodiment, operational amplifiers 442 and 444 are internal components of a CS3301A or CS3302A programmable gain amplifier available from Cirrus Logic, Inc. of Austin, Tex.

In at least one embodiment, the floating supply voltage generator 402 is a power transfer circuit that transfers power from fixed voltage supply 411 to power storage circuits. In at least one embodiment, the power storage circuits are capacitors 424 and 430. The floating supply voltage generator 402 includes a $V_{FLOAT}$ controller 410 that operates switches 418 and 420. $V_{FLOAT}$ controller 410 operates switches 418 and 420 so that capacitor 422 alternatively charges to voltage $V_{DD}$—GND and transfers the charge to capacitor 424. The floating supply voltage generator 402 receives the common mode voltage $V_{CM}$ as a reference voltage. Capacitor 424 is referenced on one node to the common mode voltage $V_{CM}$ and on the other node to node 426. In at least one embodiment, $V_{FLOAT}$ controller 410 operates switches 418 and 420 to transfer charge from capacitor 422 to capacitor 424 at a rate sufficient to maintain node 426 at floating supply voltage $V_{FLOAT-}$. The switching frequency of switches 418 and 420 is a matter of design choice and depends upon, for example, the size of capacitors 422 and 424, the current demand of devices supplied with power from floating supply voltage generator 402, the value of floating supply voltage $V_{FLOAT+}$, and the amount of ripple voltage on floating supply voltage $V_{FLOAT+}$. The switching frequency of switches 418 and 420 can be fixed or variable. Exemplary values of capacitors 422 and 428 is 1 μF or smaller, and an exemplary value of capacitors 424 and 430 is 10 μF. Thus, floating supply voltage $V_{FLOAT+}$ tracks the common mode voltage $V_{CM}$. In at least one embodiment, charge is transferred from capacitor 422 to capacitor 424 so that $V_{FLOAT+}-V_{CM}-V_M=V_{DD}$.

The floating supply voltage generator 402 also includes $V_{FLOAT}$ controller 412. $V_{FLOAT}$ controller 412 operates in the same manner as $V_{FLOAT}$ controller 410 to transfer power from capacitor 428 to 430. $V_{FLOAT}$ controller 412 operates switch 432 between node 436 at voltage $V_{DD}$ and node 438 at $V_{CM}$ and operates switch 434 between the GND node and node 440 at $V_{FLOAT-}$. Thus, floating supply voltage $V_{FLOAT-}$ also tracks the common mode voltage $V_{CM}$. In at least one embodiment, power is transferred from capacitor 428 to capacitor 430 so that $[(V_{FLOAT-})+V_{CM}+V_M]=-V_{DD}$.

Electronic system 400 also includes amplifiers 442 and 444. Although amplifiers 442 and 444 are depicted individually, amplifiers 442 and 444 can be part of a dual input, dual output amplifier 445. Amplifiers 442 and 444 operate from floating supply voltages $V_{FLOAT-}$ and $V_{FLOAT-}$. Thus, regardless of the value of common mode voltage $V_{CM}$, amplifiers 442 and 444 are able to process respective input signals $V_{IN+}$ and $V_{IN-}$ without clipping the output signals $V_{OUT+}$ and $V_{OUT-}$. The gain of amplifiers 442 and 444 is a matter of design choice and is the overall gain of the amplifiers 442 and 444 established by the values of resistors 446, 447, and 450.

A switched capacitor network 449 of ADC 448 receives output signals $V_{OUT+}$ and $V_{OUT-}$. The switched capacitor network 449 transfers a charge proportion to the difference signal $(V_{OUT+})-(V_{OUT-})$ to node 451 of ADC signal processor 452 and transfers a charge proportional to the difference signal $(V_{OUT-})-(V_{OUT+})$ to node 454 of ADC in accordance with timing signals $\Phi_1$, $\Phi_{1D}$, $\Phi_2$, and $\Phi_{2D}$. Timing signals $\Phi_1$, $\Phi_{1D}$, $\Phi_2$, and $\Phi_{2D}$ control the conductivity of switches 456-470 in accordance with Table 1:

TABLE 1

| Timing Signal | Switches Controlled |
| --- | --- |
| $\Phi_1$ | 464 and 466 |
| $\Phi_{1D}$ | 456 and 462 |
| $\Phi_2$ | 468 and 470 |
| $\Phi_{2D}$ | 458 and 460 |

ADC 448 is, for example, a 24-bit geophysical, single/dual-channel delta-sigma modulators part number CS5371A or CS5372A available from Cirrus Logic, Inc. of Austin, Tex. The particular frequency of timing signals timing signals $\Phi_1$, $\Phi_{1D}$, $\Phi_2$, and $\Phi_{2D}$ is a matter of design choice and depends upon, for example, a desired sample rate of output signals $V_{OUT+}$ and $V_{OUT-}$.

Figure 5:
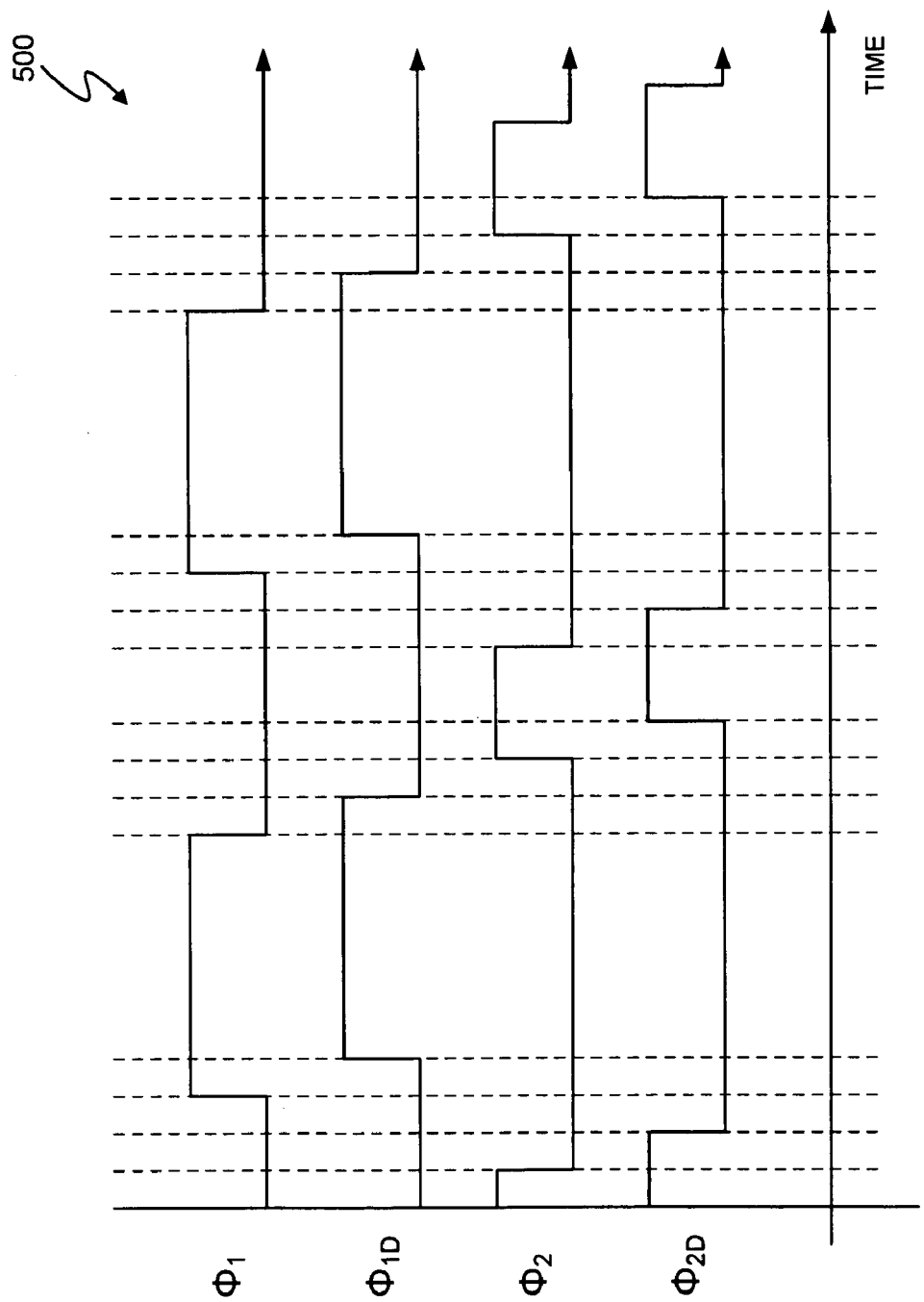
FIG. 5 depicts timing signals for a switched capacitor network of the electronic system of FIG. 4.

FIG. 5 depicts an exemplary embodiment of timing signals $\Phi_1$, $\Phi_{1D}$, $\Phi_2$, and $_{2D}$ 500. In the embodiment of FIG. 5, switches 456-470 conduct when the timing signal controlling the respective switch is 'high', and switches 456-470 are nonconductive when the timing signal controlling the respective switch is 'low'.

Figure 6:
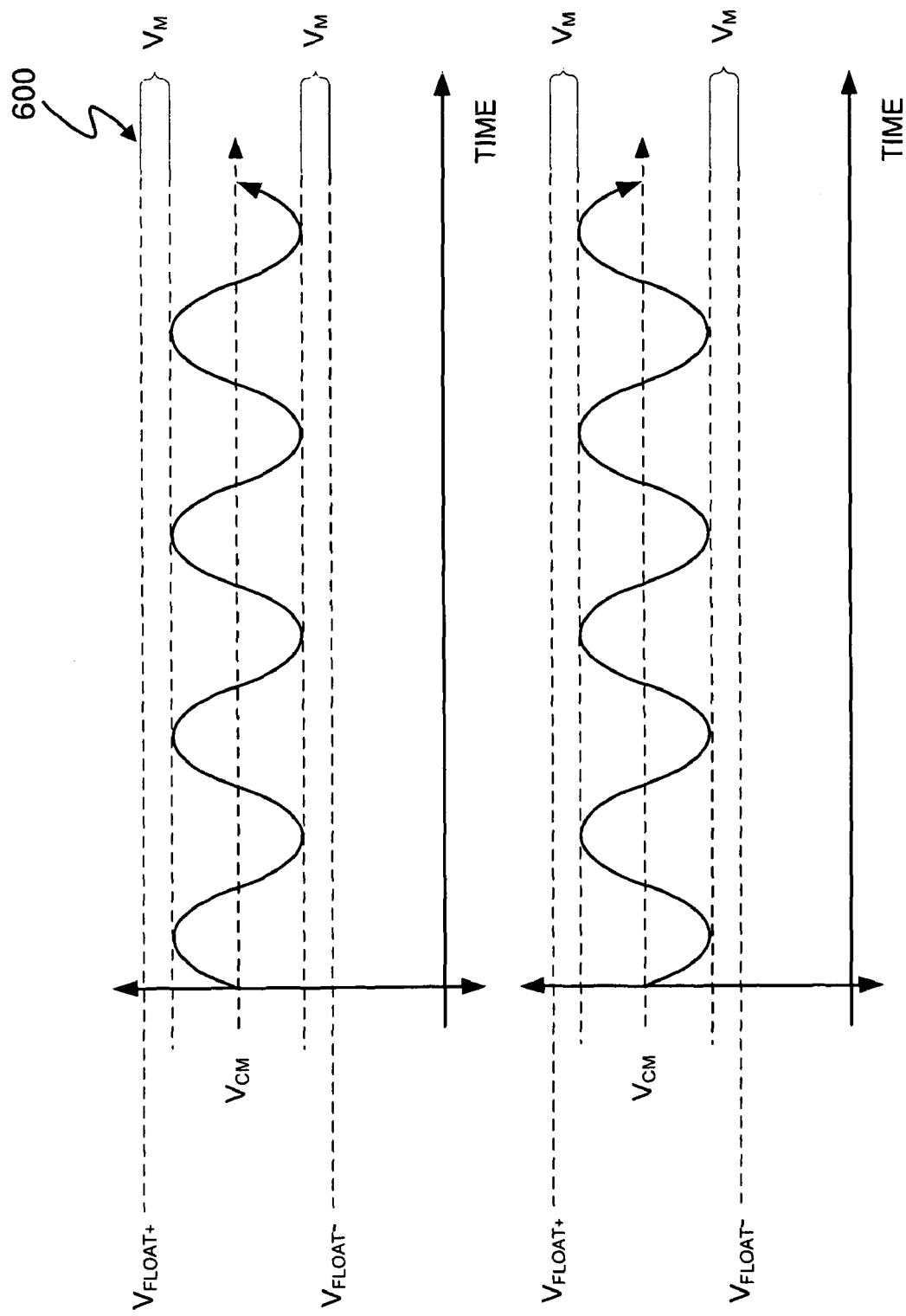
FIGS. 6 and 7 depict a tracking relationship between the floating supply voltages of the electronic system of FIG. 4 and different common mode voltages.

Referring to FIGS. 4, 5, and 6, when timing signals $\Phi_1$ and $\Phi_{1D}$ are high, capacitors 472 and 474 respectively charge to $(V_{CM}(ADC)-V_{OUT+})$ and $(V_{CM}(ADC)-V_{OUT-})$. The voltage at node 476 is set to the common mode voltage ("$V_{CM}(ADC)$") of the ADC 448, which is often $V_{DD}/2$. When timing signals $\Phi_2$ and $\Phi_{2D}$ are high, capacitor 472 charges to $(V_{CM}(ADC)-V_{OUT-})$. Therefore, the net transfer of charge across capacitor 472 is proportional to $[(V_{CM}(ADC)-V_{OUT-})-(V_{CM}(ADC)-V_{OUT+})]=(V_{OUT+}-V_{OUT-})$. Since $V_{OUT+}$ and $V_{OUT-}$ both include the common mode voltage $V_{CM}$, the switch capacitor network 449 eliminates the common mode voltage $V_{CM}$ from the difference signal $(V_{OUT+}-V_{OUT-})$. Similarly, when timing signals $\Phi_2$ and $\Phi_{2D}$ are high, capacitor 474 charges to $(V_{CM}(ADC)-V_{OUT+})$. Therefore, the net transfer of charge across capacitor 474 is proportional to $-[(V_{CM}(ADC)-V_{OUT-})-(V_{CM}(ADC)-V_{OUT+})]=(V_{OUT-}-V_{OUT+})$. Since $V_{OUT+}$ and $V_{OUT-}$ both include the common mode voltage $V_{CM}$, the switch capacitor network 449 eliminates the common mode voltage $V_{CM}$ from the difference signal $(V_{OUT-}-V_{OUT+})$.

The bandgap reference 480 provides proper scaling of the digital output signal y(n) from ADC 448. Digital Input/Output (I/O) 482 connects the digital output signal y(n) to downstream components (not shown). In at least one embodiment, ADC signal processor 452, bandgap reference 480, and digital I/O 482 operate from supply voltage $V_{DD}$ and a ground reference GND. In at least one embodiment, ADC signal processor 452, bandgap reference 480, and/or digital I/O 482 operate from supply voltages $V_{DD+}$ and $V_{DD-}$.

Figure 7:
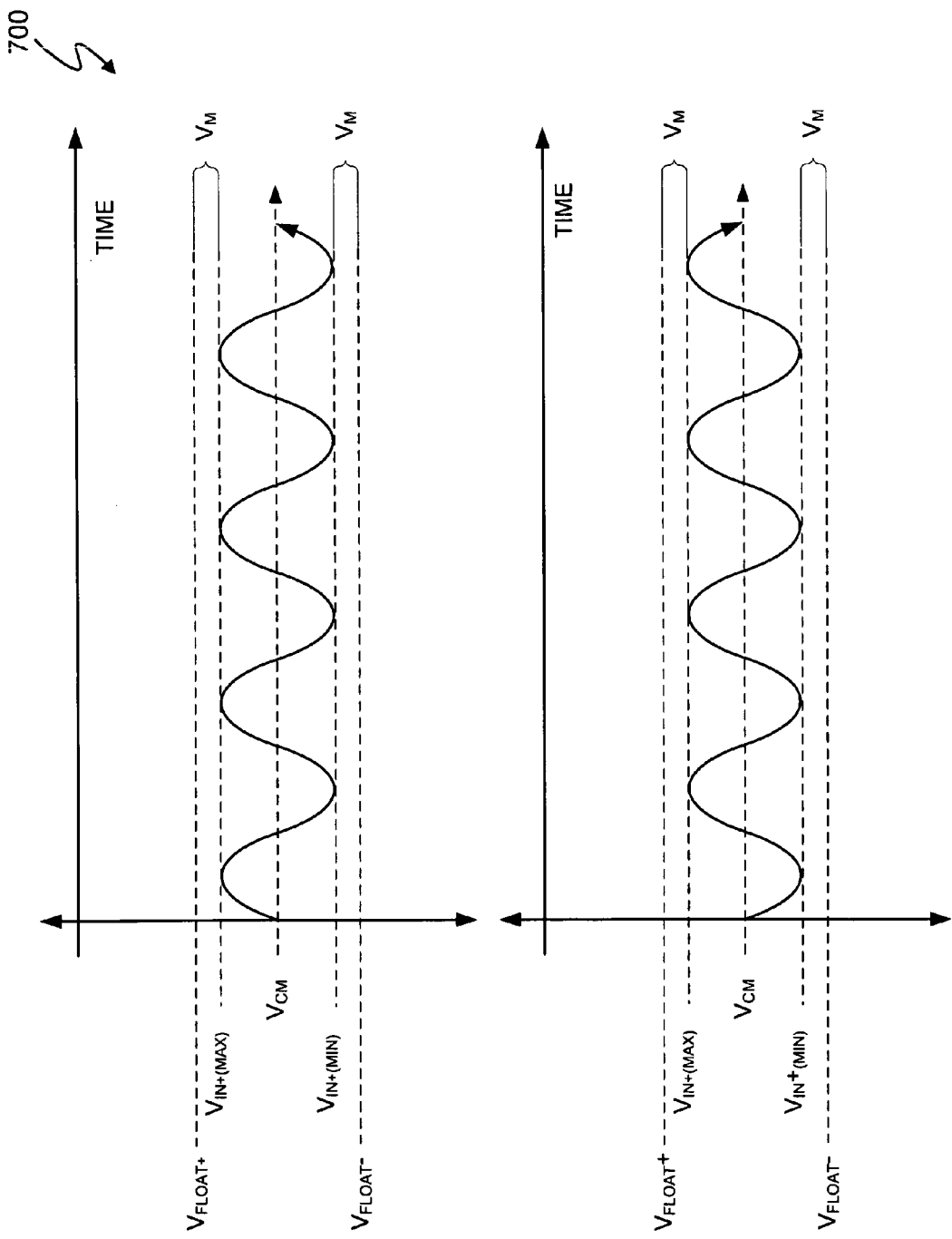

FIGS. 6 and 7 depict two embodiments of input signals $V_{IN+}$ and $V_{IN-}$ relative to common mode voltage $V_{CM}$ and floating supply voltages $V_{FLOAT+}$ and $V_{FLOAT-}$ for unity gain amplifiers 442 and 444. The common mode voltage $V_{CM}$ is positive for plot 600 and negative for plot 700. A comparison of signal plot 600 to signal plot 700 of FIGS. 6 and 7 depicts a tracking relationship between the floating supply voltages $V_{FLOAT+}$ and $V_{FLOAT-}$ of electronic system 400 and different common mode voltages $V_{CM}$.

Figure 8:
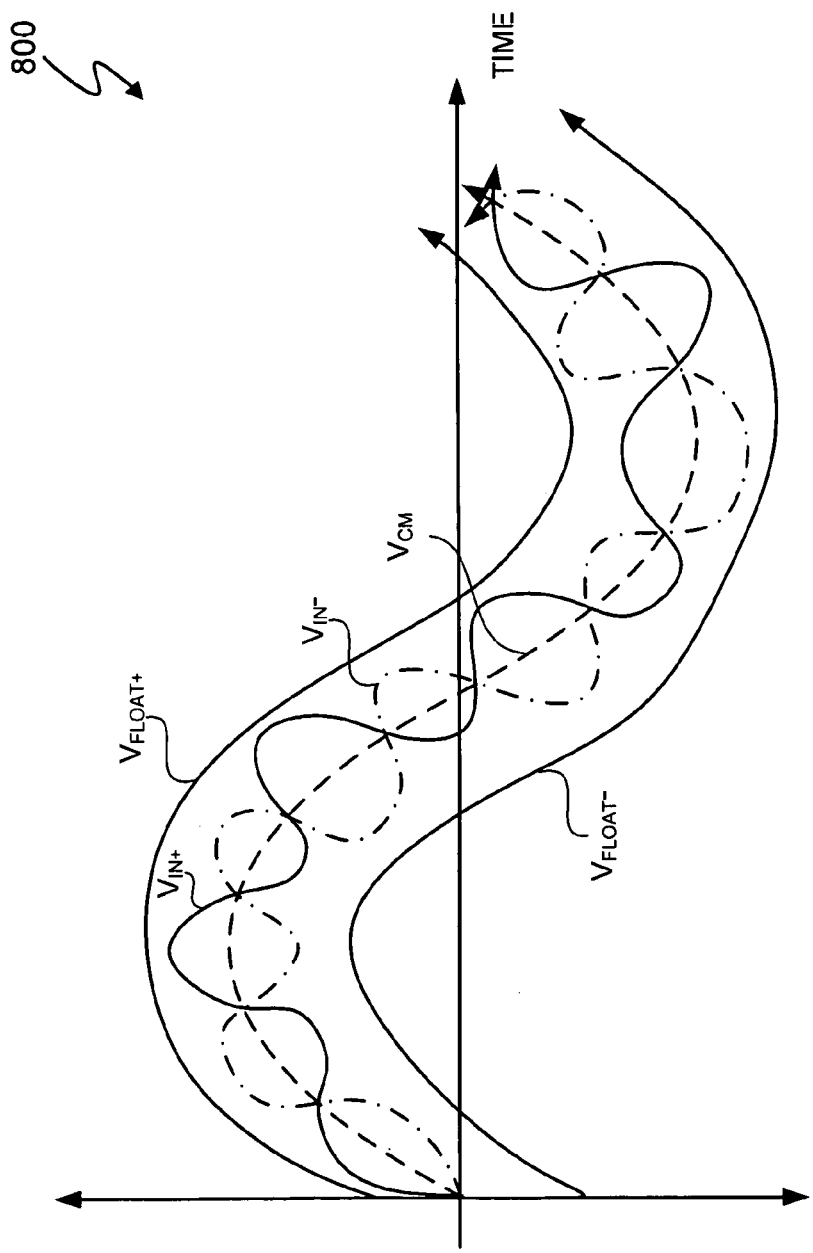
FIG. 8 depicts a tracking relationship between the floating supply voltages of the electronic system of FIG. 4 and a time-varying common mode voltage.

FIG. 8 depicts a tracking relationship between the floating supply voltages $V_{FLOAT+}$ and $V_{FLOAT-}$ of the electronic system 400 and a time-varying common mode voltage $V_{CM}$. The differential signals $V_{INS+}$ and $V_{INS-}$ are superimposed on the time-varying common mode voltage $V_{CM}$, and the floating supply voltages $V_{FLOAT+}$ and $V_{FLOAT-}$ track the common mode voltage $V_{CM}$.

FIG. 9 depicts a supply voltage generator 900, which represents one embodiment of floating supply voltage generator 302. Supply voltage generator 900 is a power transfer circuit that receives an alternating current (AC) voltage $V_{AC}$ on a primary coil 902 of 1:N transformer 904. "N" represents the ratio of turns of primary coil 902 to turns of secondary coil 906. The voltage $V_{AC}$ can be supplied from any source and, in at least one embodiment, is generated internally from supply voltages $V_{DD+}$ and $V_{DD-}$. Transformer 904 includes a center tap 908 at the common mode voltage $V_{CM}$ so that the floating supply voltages $V_{FLOAT+}$ and $V_{FLOAT-}$ track the common voltage $V_{CM}$. The output of transformer 904 is rectified by rectifier 910 to generate floating supply voltages $V_{FLOAT+}$ and $V_{FLOAT-}$ across filter capacitor 912 to form a floating supply voltage source. In at least one embodiment, rectifier 910 is a full-bridge diode rectifier. The capacitance of filter capacitor 912 is a matter of design choice and is, for example, 10 μF.

Thus, in at least one embodiment, a large common mode voltage is superimposed on relatively small differential signals. In at least one embodiment, the electronic system reduces power for an ADC system by generating floating supply voltages that track the common mode voltage and have values sufficient to process the differential signals and differential output signals.

Although the present invention has been described in detail, it should be understood that various changes, substitutions and alterations can be made hereto without departing from the spirit and scope of the invention as defined by the appended claims.

What is claimed is:

1. An apparatus comprising:
   a circuit to generate a floating first supply voltage, wherein during operation of the circuit the first supply voltage tracks a common mode voltage of first and second input signals, wherein the circuit is further configured to generate a second supply voltage and, during operation of the circuit, the second supply voltage tracks the common mode voltage;
   a first amplifier having a first voltage input terminal coupled to the circuit to receive the first supply voltage and a second voltage terminal to receive the second supply voltage, wherein during operation the first amplifier receives and amplifies the first input signal to generate a first amplified input signal;
   a second amplifier having a first voltage input terminal coupled to the circuit to receive the first supply voltage and a second voltage terminal to receive the second supply voltage, wherein during operation the second amplifier receives and amplifies the second input signal to generate a second amplified input signal; and an analog-to-digital converter, the analog-to-digital converter comprising:
an input sampling circuit coupled to the first amplifier and the second amplifier to sample the first and second amplified input signals and substantially eliminate the common mode voltage from the first and second amplified input signals.

2. The apparatus of claim 1 further comprising:
a first amplifier having a voltage input terminal coupled to the circuit to receive the first supply voltage.

3. The apparatus of claim 1 wherein the circuit further comprises:
a power transfer circuit to transfer power from a first fixed voltage supply to a first power storage circuit to generate the first supply voltage, wherein the first power transfer circuit is referenced to the common mode voltage.

4. The apparatus of claim 3 wherein the power transfer circuit is further configured to transfer power from a second fixed voltage supply to a second power storage circuit to generate a second supply voltage that tracks the common mode voltage, wherein the second power storage circuit is referenced to the common mode voltage, the apparatus further comprising:
an amplifier having voltage input terminals to receive the first and second supply voltages.

5. The apparatus of claim 4 wherein the power transfer circuit comprises a switched capacitor network to transfer power from a first set of capacitors to a second set of capacitors, wherein the second set of capacitors are referenced to the common mode voltage.

6. The apparatus of claim 4 wherein the power transfer circuit comprises a transformer to transfer power from a supply voltage source to a floating voltage source, wherein the transformer includes a primary coil coupled to the supply voltage source, a secondary coil coupled to the floating voltage source, and a center tap referenced to the common mode voltage.

7. The apparatus of claim 1 further comprising:
a first input terminal to receive the first input signal;
a second input terminal to receive the second input signal;
a common mode detection circuit, coupled to the first and second input terminals, to generate the common mode voltage of the first and second input signals;
wherein the circuit to generate the first supply voltage includes a reference terminal coupled to the common mode detection circuit to receive the common mode voltage and the circuit further includes a first voltage supply terminal to receive the first supply voltage.

8. The apparatus of claim 7 wherein the first input signal includes a first signal component plus the common mode voltage, the second input signal includes a second signal component plus the common mode voltage, and the first and second signal components are differential signals.

9. The apparatus of claim 1 wherein the circuit is further configured to generate a floating second supply voltage, wherein the second supply voltage tracks the common mode voltage and the second supply voltage is an opposite polarity equivalent of the first input signal.

10. The apparatus of claim 1 wherein the input sampling circuit comprises:
a switched capacitor network to transfer first and second amplified input difference signals to a signal processor.

11. The apparatus of claim 10 wherein the analog-to-digital converter further includes the signal processor.

12. A method comprising:
generating a floating first supply voltage that tracks a common mode voltage of first and second input signals, wherein generating the floating first supply voltage further comprises:
transferring first power from a first fixed voltage supply using a primary transformer coil coupled to a secondary transformer coil, wherein the secondary transformer coil includes a center tab coupled to the common mode voltage;
providing the first supply voltage to a first circuit;
generating a floating second supply voltage that tracks the common mode voltage; and providing the second supply voltage to the first circuit.

13. The method of claim 12 wherein the first circuit is a first amplifier, the method further comprising:
providing the first and second supply voltages to the first circuit and to a second amplifier;
amplifying the first input signal with the first amplifier to generate a first amplified input signal; and
amplifying the second input signal with the second amplifier to generate a second amplified input signal.

14. The method of claim 13 further comprising:
converting a difference between the first and second amplified signals into a digital signal.

15. The method of claim 13 wherein the first input signal includes a first signal component plus the common mode voltage, the second input signal includes a second signal component plus the common mode voltage, and the first and second signal components are differential signals.

16. The method of claim 12 wherein generating the floating first supply voltage further comprises:
transferring first power from a first fixed voltage supply to a first power storage circuit, wherein the first power storage circuit is referenced to the common mode voltage; and
transferring second power from a second fixed voltage supply to a second power storage circuit, wherein the second power storage circuit is referenced to the common mode voltage.

17. The method of claim 16 wherein transferring first power comprises transferring power from a first capacitor referenced to a ground voltage to a second capacitor referenced to the first fixed voltage supply and the common mode voltage and transferring second power comprises transferring power from a third capacitor to a fourth capacitor referenced to the second fixed voltage supply and the common mode voltage.

18. The method of claim 12 further comprising:
detecting the common mode voltage.

19. An apparatus comprising:
a circuit to generate a floating first supply voltage, wherein during operation of the circuit the first supply voltage tracks a common mode voltage of first and second input signals;
a power transfer circuit to transfer power from a first fixed voltage supply to a first power storage circuit to generate the first supply voltage, wherein the first power transfer circuit is referenced to the common mode voltage;
wherein:
the power transfer circuit is further configured to transfer power from a second fixed voltage supply to a second power storage circuit to generate a second supply voltage that tracks the common mode voltage, wherein the second power storage circuit is referenced to the common mode voltage; and the power transfer circuit comprises a transformer to transfer power from a supply voltage source to a floating voltage source, wherein the transformer includes a primary coil coupled to the supply voltage source, a secondary coil coupled to the floating voltage source, and a center tap referenced to the common mode voltage; and an amplifier having voltage input terminals to receive the first and second supply voltages.

20. The apparatus of claim 19 further comprising:
a first amplifier having a voltage input terminal coupled to the circuit to receive the first supply voltage.

21. The apparatus of claim 19 further comprising:
a first input terminal to receive the first input signal;
a second input terminal to receive the second input signal;
a common mode detection circuit, coupled to the first and second input terminals, to generate the common mode voltage of the first and second input signals;
wherein the circuit to generate the first supply voltage includes a reference terminal coupled to the common mode detection circuit to receive the common mode voltage and the circuit further includes a first voltage supply terminal to receive the first supply voltage.

22. The apparatus of claim 21 wherein the first input signal includes a first signal component plus the common mode voltage, the second input signal includes a second signal component plus the common mode voltage, and the first and second signal components are differential signals.

23. The apparatus of claim 19 wherein the circuit is further configured to generate a floating second supply voltage, wherein the second supply voltage tracks the common mode voltage and the second supply voltage is an opposite polarity equivalent of the first input signal.

24. The apparatus of claim 19 wherein the circuit is further configured to generate a second supply voltage and, during operation of the circuit, the second supply voltage tracks the common mode voltage, the apparatus further comprising:
a first amplifier having a first voltage input terminal coupled to the circuit to receive the first supply voltage and a second voltage terminal to receive the second supply voltage, wherein during operation the first amplifier receives and amplifies the first input signal to generate a first amplified input signal; and
a second amplifier having a first voltage input terminal coupled to the circuit to receive the first supply voltage and a second voltage terminal to receive the second supply voltage, wherein during operation the second amplifier receives and amplifies the second input signal to generate a second amplified input signal.

25. The apparatus of claim 24 further comprising:
an analog-to-digital converter, the analog-to-digital converter comprising:
an input sampling circuit coupled to the first amplifier and the second amplifier to sample the first and second amplified input signals and substantially eliminate the common mode voltage from the first and second amplified input signals.

26. The apparatus of claim 25 wherein the input sampling circuit comprises:
a switched capacitor network to transfer first and second amplified input difference signals to a signal processor.

27. The apparatus of claim 26 wherein the analog-to-digital converter further includes the signal processor.

* * * * *